Jan. 31, 1967

M. E. NEUMANN 3,302,037

TRIGGER CIRCUIT WITH HIGH POWER GAIN

Filed July 2, 1963

Inventor
Manfred Neumann
By W. Roberts
Attorney

United States Patent Office 3,302,037

Patented Jan. 31, 1967

3,302,037

TRIGGER CIRCUIT WITH HIGH POWER GAIN

Manfred E. Neumann, New Berlin, Wis., assignor to Allis-Chalmers Manufacturing Company, Milwaukee, Wis.

Filed July 2, 1963, Ser. No. 292,347
3 Claims. (Cl. 307—88.5)

This invention relates generally to a semi-conductor trigger circuit, more specifically to an improved trigger circuit with high gain.

A trigger circuit is a circuit with two stable states. Some trigger circuits have two stages with the output stage connected to provide positive feedback at the input stage. In such a circuit a small change at the input causes the circuit to regeneratively switch from one stable state to the other. Circuits of this general type are useful in signaling their state to other circuits; they are also useful for driving a load that has only two states, for example, a solenoid operated valve that is either fully open or fully closed. However, most trigger circuits do not satisfactorily perform both functions—signaling a state and driving a power consuming load; usually an additional stage is provided for amplification. One of the objects of this invention is to provide an improved trigger circuit that provides a high power gain with only two stages.

A Schmitt trigger, a well known circuit of this general type, illustrate the difficulties in providing high power gain. A Schmitt trigger may comprise an input transistor and an output transistor, each with an individual collector resistor and with a common emitter resistor. A resistor connects the base terminal of the output transistor to the collector terminal of the input transistor. When the input transistor is on, its emitter-collector circuit connects the base terminal of the output transistor to a point of reverse biasing potential to turn off the output transistor; when it is off, its collector resistor connects the base terminal of the output transistor to a source of forward bias potential to turn on the output transistor. The common emitter resistor provides positive feedback that makes the circuit a trigger rather than an amplifier. The common emitter resistor also establishes the voltage level required at the input to forward bias or reverse bias the base-emitter junction of the input transistor to switch the circuit from one state to the other.

The fact that the feedback resistor performs these two functions establishes an interrelation between the power output and the input signal variation required to trigger the circuit. When the input transistor is on and the output transistor is off, the emitter resistor and the input collector resistor form a voltage divider (along with other collector loads on the input transistor) and give the input emitter a voltage that establishes the input voltage level at which the input transistor will turn off. When the input transistor is off and the output transistor is on, the emitter resistor and the output collector resistor form a voltage divider and give the input transistor emitter a voltage that establishes the input level at which the input transistor can be turned on.

If the input and output collector resistances have equal values, the trigger level is about the same for either state. Varying the input slightly above this level triggers the circuit. If the collector resistors have different values, the trigger level differs for the two states. This requires a larger change in the input signal to change the input base terminal from one level to the other to trigger the circuit. This feature of the design presents a dilemma when such a circuit is connected to drive a high current (low resistance) load in its output collector circuit. If the input collector is given a correspondingly low resistance, the circuit requires high power (in the input collector resistor) to deenergize the load as well as to energize the load. If the input collector resistor is given a high resistance value (for low power consumption) the circuit has widely differing trigger levels for the two states, and it requires a correspondingly high voltage signal at its input. The usual solution to this problem is to make the two stages symmetrical for high voltage gain, but low power gain, and to provide a separate power stage between the trigger circuit and the load. One of the more specific objects of this invention is to provide a new and improved trigger circuit in which the positive feedback signal is developed from a voltage in the collector circuit rather than in the emitter circuit. In this circuit the trigger levels of the two stages can be adjusted independently, and they can be made very close together for a high power gain.

To understand the circuit of this invention, it will also be helpful to consider a well known bistable multivibrator circuit in which the collector terminal of each stage is connected to the base terminal of the other stage. The collector terminal of the off transistor connects the base terminal of the on transistor to a source of forward biasing potential to keep the on transistor turned on. Each base terminal is also connected by a resistor to a source of reverse bias potential. When the output transistor is on, it cooperates with the reverse biasing network of the input transistor to apply a reverse biasing potential to the base terminal of the input transistor. When the output transistor is off, its collector resistor, the collector to base resistor, and the reverse biasing resistor cooperate to provide a forward biasing potential at the base terminal of the input transistor. When the output transistor is on, the collector to base resistor and the reverse biasing resistor cooperate with the reverse biasing potential source to turn off the input transistor. In this circuit also, the resistors establish an interrelation between the power output and the signal variation for triggering. The trigger levels for the two stages can be adjusted by selecting appropriate values of the feedback resistors and the reverse biasing resistors and potential sources. However, the selection of these values involves dilemmas; and it is difficult to provide a circuit with the trigger levels close together.

The circuit of this invention has two unsymmetrical stages, a power transistor output stage and a driver transistor input stage. The power transistor has a low resistance load in its collector circuit, and the input stage has in its collector circuit a higher resistance of an appropriate value to turn on the output stage when the input transistor is turned off. This arrangement of the circuit provides high gain; the circuit also has an improved positive feedback circuit that provides closely spaced triggering levels in spite of the circuit asymmetry. The positive feedback loop includes a voltage divider connected across the load and a resistor that connects a point on the voltage divider to the trigger input. Adjusting the ratio of resistance on either side of the tapped point in the voltage divider establishes a selected feedback level when the input is off and the output is on. Adjusting the values of the resistors in relative to other resistors in the input circuit establishes the feedback level in the opposite state when the input is on and the output is off. These resistance values can be varied over a wide range of desired triggering levels without adversely affecting the power gain of the circuit.

Figures 1, 2, 3, 4:
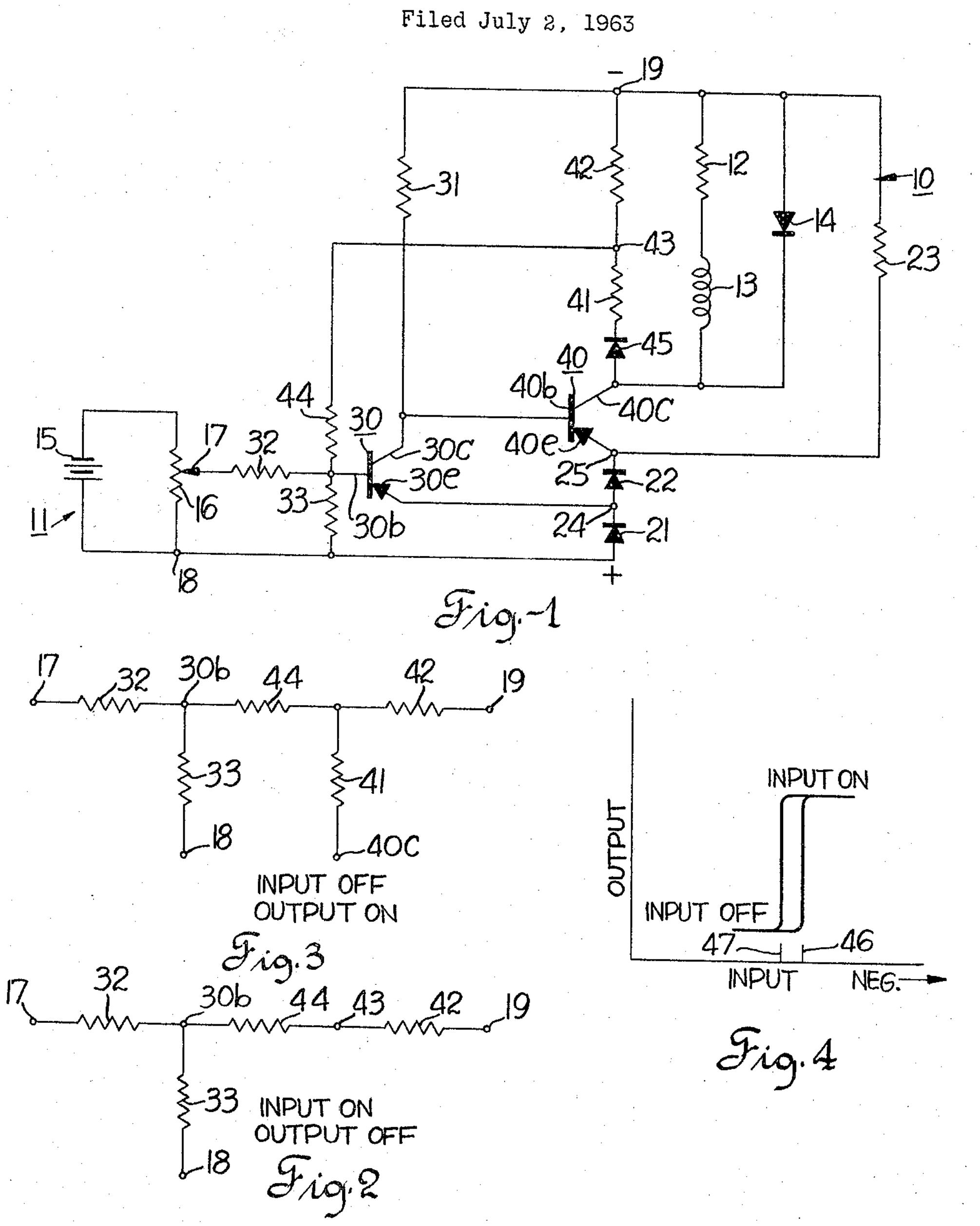
FIG. 1 is a schematic of the bistable trigger circuit of this invention.
FIGS. 2 and 3 show fragments of the circuit of FIG. 1 to illustrate how the triggering levels are established in each of the two stable states of the circuit of FIG. 1.
FIG. 4 is a curve illustrating the relation of the input and output voltages of the circuit of FIG. 1.

FIG. 1 shows the circuit of this invention connected to energize a load 10 in response to the signal level of a signal source 11. Load 10 is shown as the series combination of a resistor 12 and an inductor 13 representing a solenoid for opening and closing a valve; a diode 14 is connected to shunt reverse voltages across the inductor when the load current is interrupted. Signal source 11 is illustrated as a battery 15 and a potentiometer 16 that are connected to provide a selected level of the signal voltage between slider 17 and the common connection point 18 of one terminal of the battery and the potentiometer. Point 18 is the ground reference potential point for the circuit of this invention. Slider 17 can be considered as an input terminal of the trigger circuit.

The trigger circuit of FIG. 1 is connected to energize load 10 from a source of potential between reference point 18 and a point 19 that is negative (for the PNP transistors illustrated) with respect to point 18. The series combination of two diodes 21, 22 and a resistor 23 is connected across the source to provide biasing potentials at their common connections 24 and 25. Resistor 23 is given the appropriate value to bias diodes 21 and 22 to each operate just above the knee of their volt-ampere characteristic curves where the dynamic resistance is low so that the potentials at points 24 and 25 are substantially constant even though the diodes also conduct in the circuits of other elements of the trigger circuit.

The input stage of the trigger circuit comprises a transistor 30 having its emitter terminal 30*e* connected to be at the potential of reference point 24, a collector resistor 31 that connects the collector terminal 30*c* of transistor 30 to negative point 19, and a resistor 32 for connecting the base terminal 30*b* to signal source 11, and a resistor 33 connecting base terminal 30*b* to reference potential point 18.

Resistor 31 has sufficient conductance with respect to the supply voltage to provide the appropriate base drive for the output stage when transistor 30 is turned off. Transistor 30 is selected to provide sufficient collector current in relation to the resistance of resistor 31 to maintain the potential of collector 30*c* less negative when transistor 30 is on than when transistor 30 is off, and resistor 31 conducts in series with elements of the output stage. Resistor 33 also has sufficient conductance to maintain base terminal 30*b* positive with respect to emitter terminal 30*e* and point 24 when the output stage is on and signal source 11 provides a preset negative voltage level at terminal 17.

The output stage of the trigger circuit includes a transistor 40 that has its emitter 40*e* connected to reference potential point 25. One terminal of load 10 is connected to the collector terminal 40*c* of transistor 40 and the other terminal of load 10 is connected to point 19. Thus, when transistor 40 is driven into saturation, substantially the entire source voltage appears across the load (neglecting the small drop across diodes 21 and 22). The base 40*b* of transistor 40 is connected directly to the collector 30*c* of input transistor 30. The output stage also includes the series combination of two resistors 41 and 42 connected between collector 40*c* and point 19. The resistors 41 and 42 provide a preselected measure of the load voltage at their common connection point 43. A resistor 44 is connected between point 43 and base terminal 30*b* of the input stage to provide positive feedback from the output stage to the input stage.

A diode 45 is connected in series with resistor 41 between point 43 and collector terminal 40*c*. The diode 45 conducts in its forward direction when transistor 40 is on; its forward voltage drop is small in comparison with the voltage across resistors 41 and 42 and its effect in this part of the circuit can be neglected. In the series circuit with resistors 33, 44, 41 and load 10, diode 45 conducts negligibly with a very high resistance in its reverse direction.

Diode 45 isolates load 10 from resistors 33, 44, 41 and point 18 when transistor 40 is turned off. Many load devices are insensitive to the low value of current that would flow if diode 45 is left out of the circuit and for such applications diode 45 may be omitted.

Suppose that transistor 30 is off and transistor 40 is on. When the slider 17 is moved toward the negative end of potentiometer 16 far enough, a small negative value of potential appears at base 30*b* with respect to reference point 24 and a small increment of forward biasing current flows in the base emitter circuit of transistor 30. Except for the feedback connection 44, such a small signal would produce an amplified positive going change at collector 30*c* and base 40*b* and a corresponding amplified negative going change at collector terminal 40*c* and load 10. Point 43 also goes negative. Resistors 41, 42, 44 are proportioned to provide additional forward biasing current at the input transistor 30 at least equal to the small incremental current provide by signal source 11. With this positive feedback, the circuit regeneratively switches from its original output-energized state to an output-off state even if the input signal at slider 17 is not made more negative.

FIG. 2 shows the feedback connections in the state described in the last paragraph in which the input stage is on and the output stage is off. Thus, resistors 42, 44 provide an appropriately high conductance between terminal 30*b* and forward biasing potential point 19 to hold on input transistor 30 when source 11 provides the predetermined small negative potential at terminal 17. When diode 45 is omitted, the series combination of resistor 41 and load 10 conducts in parallel with resistor 42. When resistor 32 has a high conductance and signal source 11 has a low internal resistance, the trigger voltage level (46 in FIG. 4) at point 17 to turn on the input transistor 30 about equals the voltage established at point 24 by diode 21 plus the base-emitter voltage of transistor 30.

Resistor 33 is given sufficient conductance (with respect to the resistors connecting point 30*b* to point 19 when the input transistor 30 is on) to make the voltage of point 30*b* less negative than equivalent points 24 and 30*e* when input terminal 17 is made less negative to value 47 in FIG. 4. Thus, moving slider 17 slightly toward the negative terminal 18 turns off transistor 30. As transistor 30 turns off, its collector terminal 30*c* tends to go negative to somewhat forward bias base terminal 40*b* of output transistor 40 and begin turning on transistor 40. As transistor 40 goes on and its collector terminal 40*c* goes positive, a portion of the voltage at collector 40*c* appears at point 43 and is fed back to turn off input transistor 30 regeneratively.

FIG. 3 shows the feedback connections in the state discussed in the last paragraph, the input stage off and the output stage on. Point 18 and 40*c* may be considered to be at the potential of point 24 and emitter 30*e* since the voltage drop across diodes 21, 22 and across the emitter-collector circuit of transistor 40 is very small in comparison with the voltage between points 18 and 19. FIG. 3 shows equally that in this state the circuit provides feedback at base 30*b* that except for signal 17 would be positive with respect to emitter 30*e* and would maintain input transistor 30 off.

So far the circuit has been described as being responsive to variations in its input voltage with respect to a voltage level. When the input circuit is provided with an appropriate fixed bias voltage, the trigger level can be moved to within the open region of the operating loop of FIG. 4. This provides that the trigger level is zero voltage and the circuit is polarity responsive. A zener diode is a suitable device for producing higher voltages between point 18 and points 24 and 25. The circuit would switch to one state in response to a short pulse of one polarity and it would remain in that state until it received a pulse of the opposite polarity.

Because the drawing illustrates the input transistor 30 as a PNP type, this input stage turns on in response to a negative going charge at terminal 17. Because emitter terminal 30_e_ has the negative bias of diode 21, the potential at slider must be somewhat more negative than point 24 to turn on transistor 30 and less negative to turn off transistor 30. Removing diode 21 and connecting point 24 to have the potential of point 18 allows the circuit to operate with a source 11 that would provide a range of positive voltages at terminal 17. With this connection, resistors 44 and 42 tend to maintain base terminal 30_b_ forward bias to turn on transistor 30; transistor 30 turns off when terminal 17 is made suitably positive. In this connection, resistor 33 may be removed since its reverse biasing action in the circuit is then provided by the signal source.

In the embodiment that FIG. 1 illustrates, if source 11 is disconnected, the output stage turns on. In some situations it is preferable to turn the output stage on in response to a signal and off in the absence of a signal. The circuit provides this operation when emitter 30_e_ is connected to have the potential of point 18 (instead of the reverse biasing potential of point 24).

Those skilled in the art will recognize variations of the circuit within the scope of the claims.

Having now particularly described and ascertained the nature of my said invention and the manner in which it is to be performed, I declare that what I claim is:

1. A trigger circuit for connecting and disconnecting a load between first and second terminals, comprising, a resistor and two diodes connected in series between said two terminals to establish first and second reference potential points with respect to said first terminal with said diodes operating in their region of low dynamic resistance to maintain said reference potentials substantially constant, said first reference point being nearer in potential than said second point to said first terminal, an input transistor having its emitter terminal connected to have the potential of said first reference point and having a resistor connecting its collector terminal to said second terminal and having a resistor connecting its base terminal to said first terminal for turning off said input transistor, an input circuit for turning on and off said input transistor according to the input voltage level and said first reference point potential, an output transistor having its emitter terminal connected to have the potential of said second reference point and having its collector terminal connected to energize the load when turned on, means connecting said input transistor to turn the output transistor on and off according to the potential at said input transistor collector terminal and at said second reference point, and the series combination of two resistors connected between the output collector terminal and said second terminal to provide a measure of the voltage across the load at their common connection point, and means connecting said common connection point to the base terminal of said input transistor to form a trigger circuit.

2. A trigger circuit comprising:

an output transistor having its collector terminal connected to energize a load, an input transistor with a first resistance of a higher resistance than the load connected to establish the potential at its collector terminal according to the conduction state of said input transistor, means for connecting the collector of said input transistor to the base terminal of said output transistor to control the conduction state of said output transistor, the series combination of a second and third resistance connected in the collector circuit of said output transistor to provide a measure of the voltage across the load at the common connection point, means connecting said common connection point to the base terminal of said input transistor to form a trigger circuit, and a diode directly connected between the emitter of the input transistor and the emitter of the output transistor in the forward biased direction with respect to one of said emitters.

3. A trigger circuit according to claim 2 also comprising a diode connected in the forward biased direction directly to the emitter of the input transistor and to the common terminal for the circuit.

References Cited by the Examiner

UNITED STATES PATENTS

| | | | |
|---|---|---|---|
| 3,037,128 | 5/1962 | Slobodzinski | 307—88.5 |
| 3,114,053 | 12/1963 | Robinson | 307—88.5 |
| 3,193,702 | 7/1965 | Claessen | 307—88.5 |
| 3,218,483 | 11/1965 | Clapper | 307—88.5 |
| 3,233,124 | 2/1966 | Favin | 307—88.5 |

ARTHUR GAUSS, *Primary Examiner.*

J. JORDAN, *Assistant Examiner.*